(12) United States Patent
Aerts et al.

(10) Patent No.: US 11,203,372 B2
(45) Date of Patent: Dec. 21, 2021

(54) STEERING WHEEL ASSEMBLY

(71) Applicant: Tesla, Inc., Palo Alto, CA (US)

(72) Inventors: Joris Aerts, Amsterdam (NL); Felix Louis Godard, Los Angeles, CA (US); Erik Raymond Hammer, Palo Alto, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days.

(21) Appl. No.: 16/054,675

(22) Filed: Aug. 3, 2018

(65) Prior Publication Data

US 2020/0039559 A1    Feb. 6, 2020

(51) Int. Cl.
*G06F 3/0484* (2013.01)
*B62D 1/04* (2006.01)
(Continued)

(52) U.S. Cl.
CPC .......... *B62D 1/046* (2013.01); *B60R 16/0231* (2013.01); *H01H 57/00* (2013.01);
(Continued)

(58) Field of Classification Search
CPC .......... B62D 1/043; B62D 1/04; B62D 1/046; B62D 1/02; B62D 1/06; B62D 1/08; B62D 5/001; H01H 35/146; H01H 19/11; H01H 2003/008; H01H 2025/043; H01H 2215/05; H01H 9/168; H01H 13/84; H01H 21/22; H01H 2217/024; H01H 2221/012; H01H 2221/016; H01H 2231/026; H01H 25/04; H01H 57/00; H03K 17/964; H03K 17/962;
(Continued)

(56) References Cited

U.S. PATENT DOCUMENTS

| 8,406,961 B2 | 3/2013 | Pathak et al. |
| 9,067,618 B2 | 6/2015 | Cash |

(Continued)

FOREIGN PATENT DOCUMENTS

JP    2014-102660    6/2014

OTHER PUBLICATIONS

International Search Report and Written Opinion dated Nov. 15, 2019 in application No. PCT/US2019/044669.

*Primary Examiner* — Ahmed M Saeed
(74) *Attorney, Agent, or Firm* — Knobbe, Martens, Olson & Bear, LLP (57) ABSTRACT

A steering wheel assembly includes a steering rim and a steering housing connected to the steering rim. The steering wheel assembly also includes at least one pressure sensitive component disposed within the steering housing. The at least one pressure sensitive component generates electric signals in response to force applied on the steering housing. The at least one pressure sensitive component may include any one of at least one piezoelectric switch, a piezoelectric sensor, and a capacitive array. Further, at least one pressure sensitive component may provide a haptic feedback. Additionally, a Printed Circuit Board (PCB) disposed within the steering housing is electrically connected to the at least one pressure sensitive component. The PCB includes a controller that determines a user input or a gesture made by a user on the steering housing based on the electric signals received from the at least one pressure sensitive component.

20 Claims, 11 Drawing Sheets

(51) Int. Cl.
    *B60R 16/023*     (2006.01)
    *H01H 57/00*     (2006.01)
    *H03K 17/96*     (2006.01)
    *B60K 35/00*     (2006.01)
    *F16H 63/42*     (2006.01)
    *G06F 3/01*     (2006.01)

(52) U.S. Cl.
    CPC ......... *H03K 17/962* (2013.01); *H03K 17/964* (2013.01); *B60K 35/00* (2013.01); *B60K 2370/143* (2019.05); *B60K 2370/782* (2019.05); *F16H 63/42* (2013.01); *F16H 2063/423* (2013.01); *G06F 3/017* (2013.01); *H01H 2215/05* (2013.01); *H03K 2217/96062* (2013.01)

(58) Field of Classification Search
    CPC .... H03K 2217/96062; F16H 2063/423; F16H 63/42; B60R 16/027; B60R 16/0231; G06F 3/016; G06F 3/04883; G06F 3/04886; G06F 2203/0339; G06F 2203/04109; G06F 3/017; G06F 3/018; G06F 3/03547; G06F 3/0416; G06F 3/042; G06F 3/0421; G06F 3/0426; G06F 3/0428; G06F 3/044; G06F 3/0482; G06F 3/04842; G06F 3/0485; G06F 3/0489; B60K 2370/158; B60K 2370/143; B60K 2370/782; B60K 35/00

See application file for complete search history.

(56) References Cited

U.S. PATENT DOCUMENTS

| | | |
|---|---|---|
| 2013/0263692 A1 | 10/2013 | Bostick et al. |
| 2015/0097793 A1* | 4/2015 | Lisseman ................. B62D 1/04 345/173 |
| 2017/0329450 A1 | 11/2017 | Stotzem et al. |
| 2017/0329460 A1 | 11/2017 | Bae |
| 2019/0091946 A1* | 3/2019 | Lancaster-Larocque .................... H01H 13/70 |

* cited by examiner

STEERING WHEEL ASSEMBLY

TECHNICAL FIELD

The present disclosure relates to a steering wheel assembly. More particularly, the present disclosure relates to a steering wheel assembly for determining user inputs.

BACKGROUND

Steering wheel assemblies are associated with a number of automotive applications to allow a driver to maneuver a vehicle. Current steering wheel assemblies are primarily used to control a movement of vehicle. However, there are many other functionalities that the driver may need to change or update while driving, for example selecting driver-assist functionality, controlling the climate (for example increasing or decreasing the cabin temperature or increasing or decreasing the fan speed), making a telephone call, or another action. In such a situation, drivers typically have to remove at least one hand from steering wheel assembly to manipulate functionalities on another interface. This may distract the driver from driving.

Some steering wheel assemblies include scroll wheels or other mechanical switches for changing or updating vehicle functionalities. These have the advantage that the driver may manipulate certain functionality without removing the driver's hands from the steering wheel assembly. However, unintentional touches may result in an undesired actuation of a vehicle system or may cause undesired change in vehicle functionalities. Hence, there is a need for an improved steering wheel assembly for determining user inputs that overcomes the aforementioned drawbacks.

SUMMARY

The present disclosure relates to a steering wheel assembly. The steering wheel assembly includes a steering rim. The steering wheel assembly also includes a steering housing connected to the steering rim. The steering wheel assembly further includes at least one pressure sensitive component disposed within the steering housing. The at least one pressure sensitive component generates electric signals in response to force applied on the steering housing. The at least one pressure sensitive component may include any one of at least one piezoelectric switch, a piezoelectric sensor, and a capacitive array. Further, at least one pressure sensitive component may provide a haptic feedback. Additionally, a Printed Circuit Board (PCB) disposed within the steering housing is electrically connected to the at least one pressure sensitive component. The PCB includes a controller that determines a user input or a gesture made by a user on the steering housing based on the electric signals received from the at least one pressure sensitive component.

In another embodiment, a steering wheel assembly is provided. The steering wheel assembly includes a steering rim. The steering wheel assembly also includes a steering housing connected to the steering rim. The steering wheel assembly further includes at least one pressure sensitive component disposed within the steering housing. The at least one pressure sensitive component generates electric signals in response to force applied on the steering housing. The at least one pressure sensitive component may include any one of at least one piezoelectric switch, a piezoelectric sensor, and a capacitive array. Further, the at least one pressure sensitive component may provide a haptic feedback. The steering wheel assembly includes at least one PCB disposed within the steering housing. The PCB is electrically connected to the at least one pressure sensitive component. Further, the PCB includes a controller that determines a user input or a gesture made by a user on the steering housing based on the electric signals received from the at least one pressure sensitive component.

In one embodiment, a method of determining a user input on a steering wheel assembly is provided. The method includes receiving the user input on a steering housing of the steering wheel assembly. The method also includes generating, via a pressure sensitive component, electric signals in response to the user input, wherein the pressure sensitive component is disposed within the steering housing. The method further includes receiving, at a controller, electric signals generated by the pressure sensitive component. The method includes determining, via the controller, the user input based on the received electric signals. Further, controller determines the user input or a gesture made by a user on the steering housing based on the received electric signals.

Embodiments of the present disclosure and their advantages are best understood by referring to the detailed description that follows. It should be appreciated that like reference numerals are used to identify like elements illustrated in one or more of the figures, wherein showings therein are for purposes of illustrating embodiments of the present disclosure and not for purposes of limiting it.

DETAILED DESCRIPTION

Figure 1:
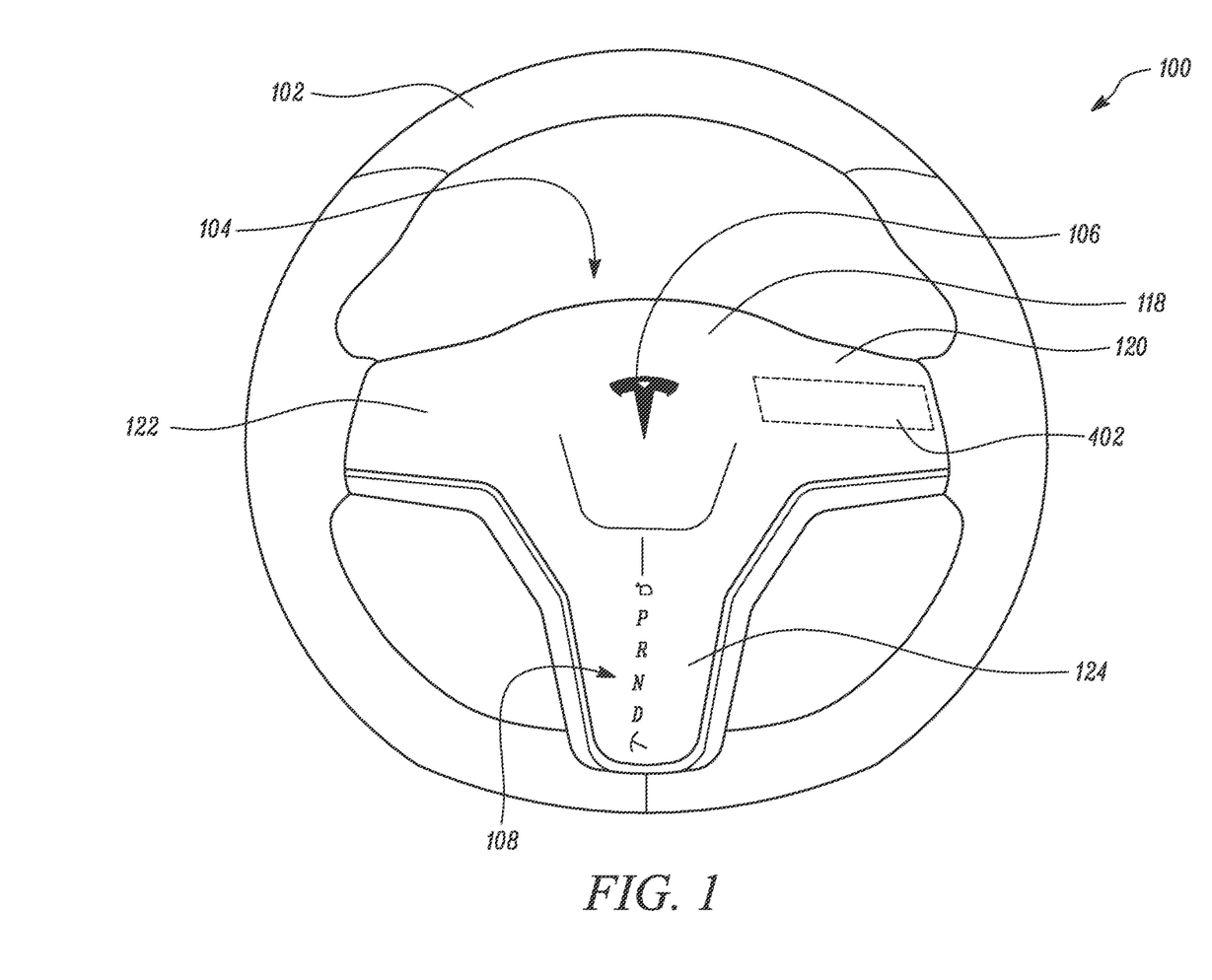
FIG. 1 illustrates a front view of an exemplary steering wheel assembly according to certain embodiments of the disclosure.

FIG. 1 illustrates a front view of a steering wheel assembly 100 associated with a vehicle (not shown), for example, a passenger car, a truck, a sport utility vehicle, or a van. In various embodiments, the vehicle is an electric vehicle, a hybrid vehicle, or a vehicle driven by an internal combustion engine. Steering wheel assembly 100 allows a user to maneuver the vehicle. Steering wheel assembly 100 includes a steering rim 102. Steering rim 102 is generally circular is shape. Further, a steering housing 104 is connected to steering rim 102. Steering housing 104 includes a central portion 118. Further, steering housing 104 includes a first portion 120 extending horizontally from a right side of central portion 118 and a second portion 122 extending horizontally from a left side of central portion 118. Additionally, a third portion 124 extends vertically from a lower side of central portion 118.

Figure 10:
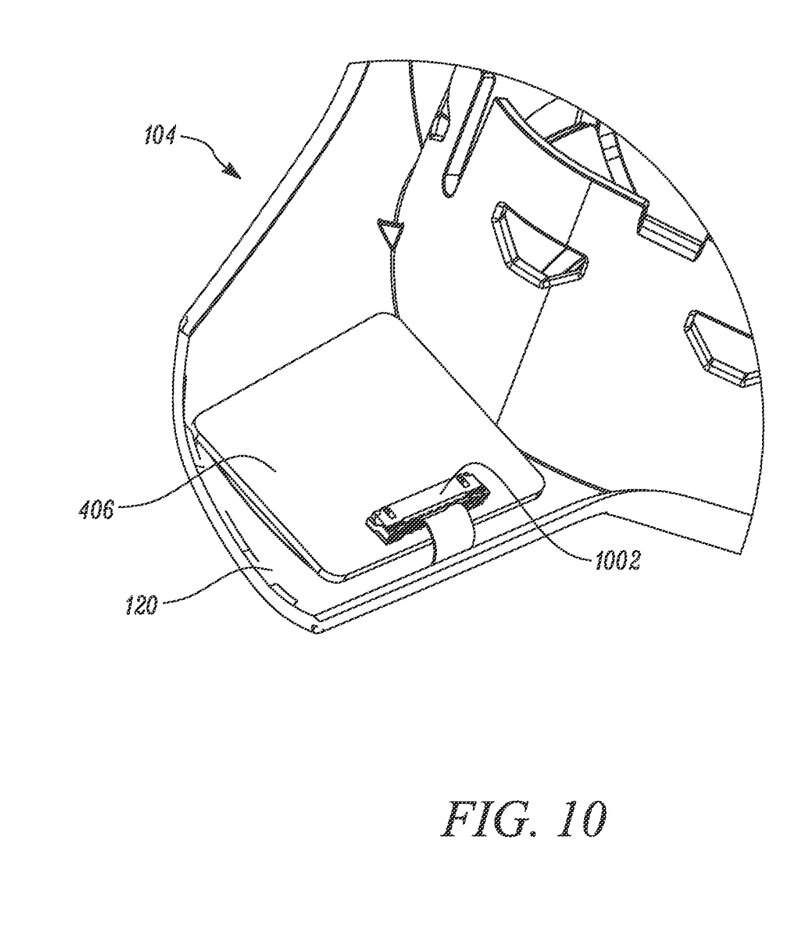
FIG. 10 illustrates the PCB and a connection bus according to certain embodiments of the disclosure.

Steering housing 104 is manufactured by performing various manufacturing steps on a film (not shown) that is made of a material, for example, polycarbonates. For manufacturing steering housing 104, the film is printed with desired graphics. The graphics may include graphics associated with visual feedback areas, for example, a badge 106 or indicators 108 that are indicative of a selected gear engagement of the vehicle. Further, the film is also printed with electrical circuits. Such electrical circuits may be used to establish electrical connections between a Printed Circuit Board (PCB) 406 (shown in FIGS. 4, 8, and 10) and a pressure sensitive component 404 (shown in FIGS. 3 and 4) or between a control unit 410 (shown in FIG. 4) of the vehicle and indicators 108. Further, one or more surface mount Light Emitting Diodes (LEDs) 502, 504 (shown in FIG. 5) and flex circuits are also disposed on the film. The film is further subjected to thermoforming in order to give steering housing 104 a three-dimensional shape. Further, the thermoformed film is cut to achieve a desired shape of the steering housing 104.

Figure 2:
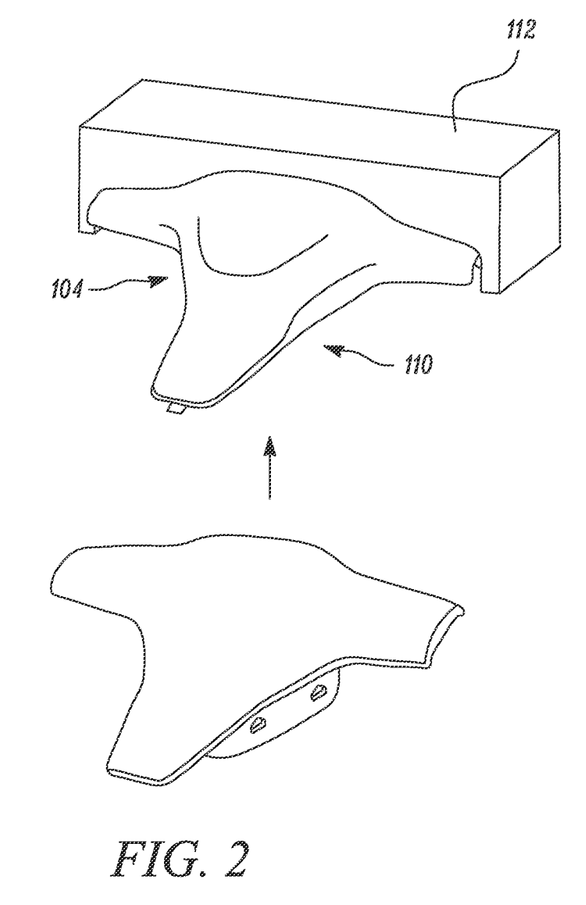
FIG. 2 illustrates a manufacturing step of a steering housing of the steering wheel assembly according to certain embodiments of the disclosure.
Figure 3:
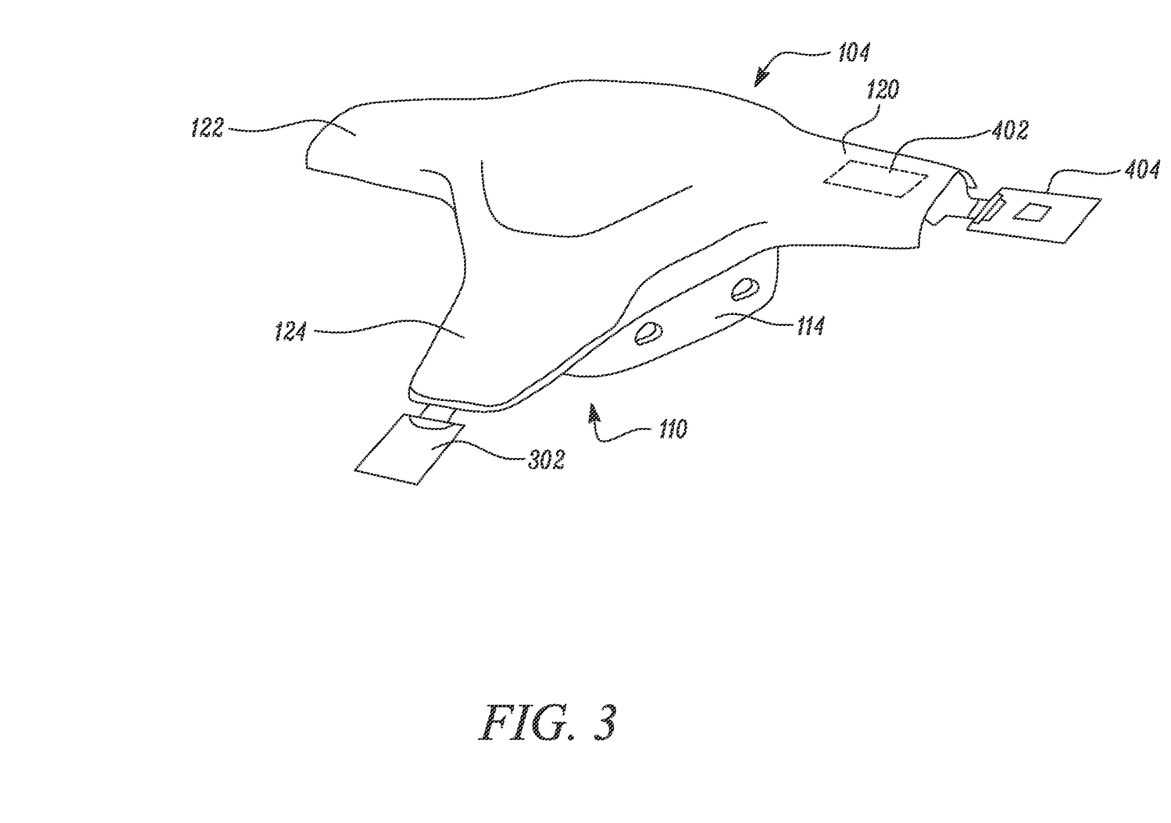
FIG. 3 illustrates an assembly step where a pressure sensitive component is disposed within the steering housing according to certain embodiments of the disclosure.

As shown in FIG. 2, steering housing 104 is subjected to injection molding using a mold cavity 112. During injection molding on steering housing 104, molten material is injected to form one or more structural components on a lower side 110 of steering housing 104. For example, an airbag housing 114 (shown in FIGS. 3 and 9) is formed on lower side 110 of steering housing 104 by injection molding. Airbag housing 114 is used for holding an airbag (not shown). As shown in FIG. 3, one or more pressure sensitive components 404 are disposed in steering housing 104 after injection molding is performed on steering housing 104. In the illustrated embodiment, pressure sensitive component 404 is disposed in first portion 120 of steering housing 104. In an embodiment, pressure sensitive component 404 may include a PCB that is connected to a connection bus. Additionally, another pressure sensitive component may be disposed in second portion 122 of steering housing 104. In some embodiments, a control unit 302 is disposed in the third portion 124 of steering housing 104. In embodiments, control unit 302 may embody a PCB. The control unit 302 may be electrically connected to the PCB of the pressure sensitive component 404 by the connection bus. Subsequently, an airbag is disposed within airbag housing 114 of steering housing 104 after which steering housing 104 is assembled with steering rim 102 to form steering wheel assembly 100.

Figure 4:
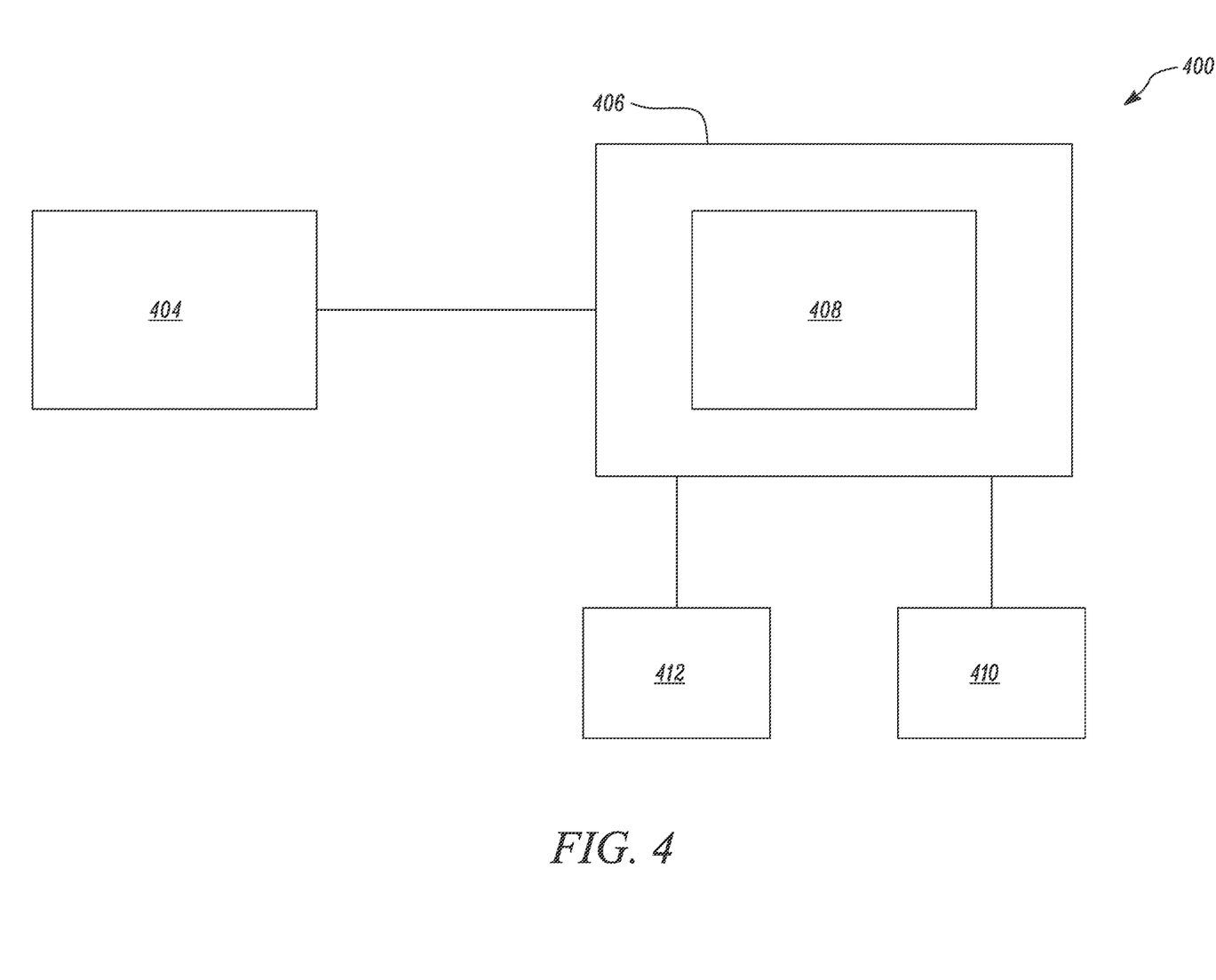
FIG. 4 illustrates a user input determination system for determining a user input on the steering wheel assembly according to certain embodiments of the disclosure.

As shown in FIG. 4, steering wheel assembly 100 includes a user input determination system 400. User input determination system 400 determines various user inputs that are provided by user and allows user to navigate through a menu of controls. In an embodiment, user inputs include gestures that are performed by user. User input determination system 400 includes an input area 402 (shown in FIGS. 1 and 3). Input area 402 is a predefined area that may be easily accessed by thumbs or fingers of user without having to disengage contact from steering wheel assembly 100 while driving. Input area 402 may be present at one or more portions of steering wheel assembly 100. In the illustrated embodiment, input area 402 is present on first portion 120 of steering housing 104. In another embodiment, input area 402 may be present on second portion 122 of steering housing 104 or on both first and second portions 120, 122 of steering housing 104. In yet another embodiment, input area 402 may be present on central portion 118 of steering housing 104. A peripheral portion 510 (shown in FIG. 5) of steering housing 104 is disposed around input area 402. Further, surface mount LEDs 502, 504 are mounted within peripheral portion 510 and vertically below input area 402.

In embodiments, by interacting with input area 402, user may be able to select, update, and/or navigate through menu of controls. Further, based on user inputs and determination made by user input determination system 400, user may receive feedback of the selections made. User's interaction may occur through gestures made directly on input area 402. Gestures may include soft press, hard press, single press, double press, press and hold, or any other gesture or combination of gestures. In another example, multiple or complex gestures may be determined by user input determination system 400.

Figure 7:
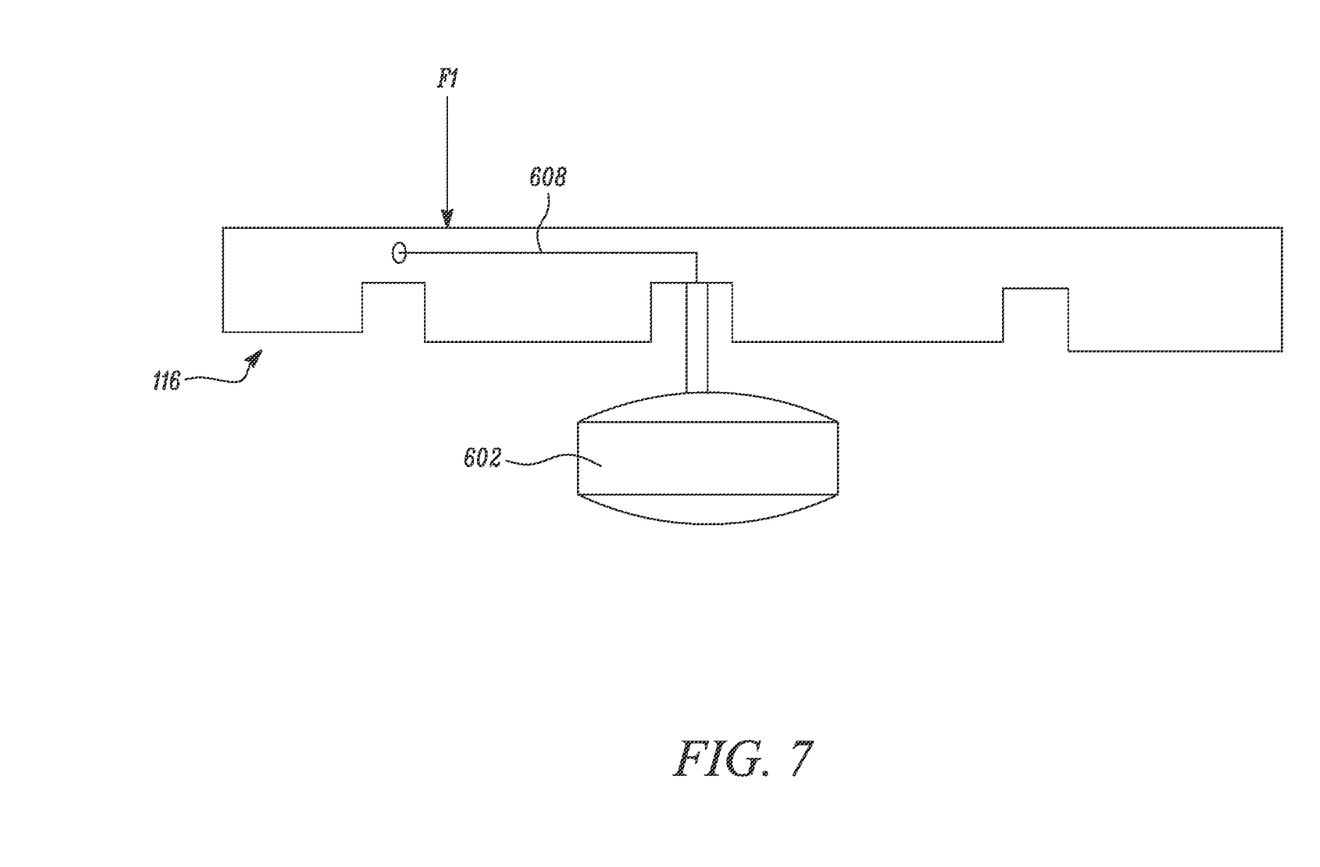
FIG. 7 illustrates a side view of a single webbing connected to the piezoelectric sensor according to certain embodiments of the disclosure.

In order to improve user convenience and safety, user input determination system 400 includes one or more pressure sensitive components 404. Pressure sensitive components 404 actuate only when a certain amount of force is applied on them. For example, a force "F 1" (shown in FIGS. 5 and 7) applied on input area 402 by user is transmitted on to pressure sensitive components 404 in order to actuate pressure sensitive components 404. The force "F1" may be greater than a predetermined threshold. Pressure sensitive components 404 are arranged to allow determination of user inputs anywhere on input area 402. Thus, pressure sensitive components 404 may increase user convenience as user does not have to find and press a particular button to allow determination of user inputs. Further, pressure sensitive components 404 may also increase user safety as user does not have to look at input area 402 to find and press a particular button to allow determination of user inputs.

Pressure sensitive component 404 is disposed within steering housing 104 and vertically below input area 402. Pressure sensitive component 404 may be present at one of first and second portions 120, 122 or at both first and second portions 120, 122 of steering housing 104. In the illustrated embodiment, steering housing 104 includes single pressure sensitive component 404 at first portion 120. Pressure sensitive component 404 generates electric signals in response to force "F 1" that is applied on steering housing 104. In certain embodiments, user input determination system 400 determines user inputs using force sensing. In such embodiments, pressure sensitive component 404 includes at least one piezoelectric switch 506 (shown in FIG. 5) or a piezoelectric sensor 602 (shown in FIG. 6).

Figure 5:
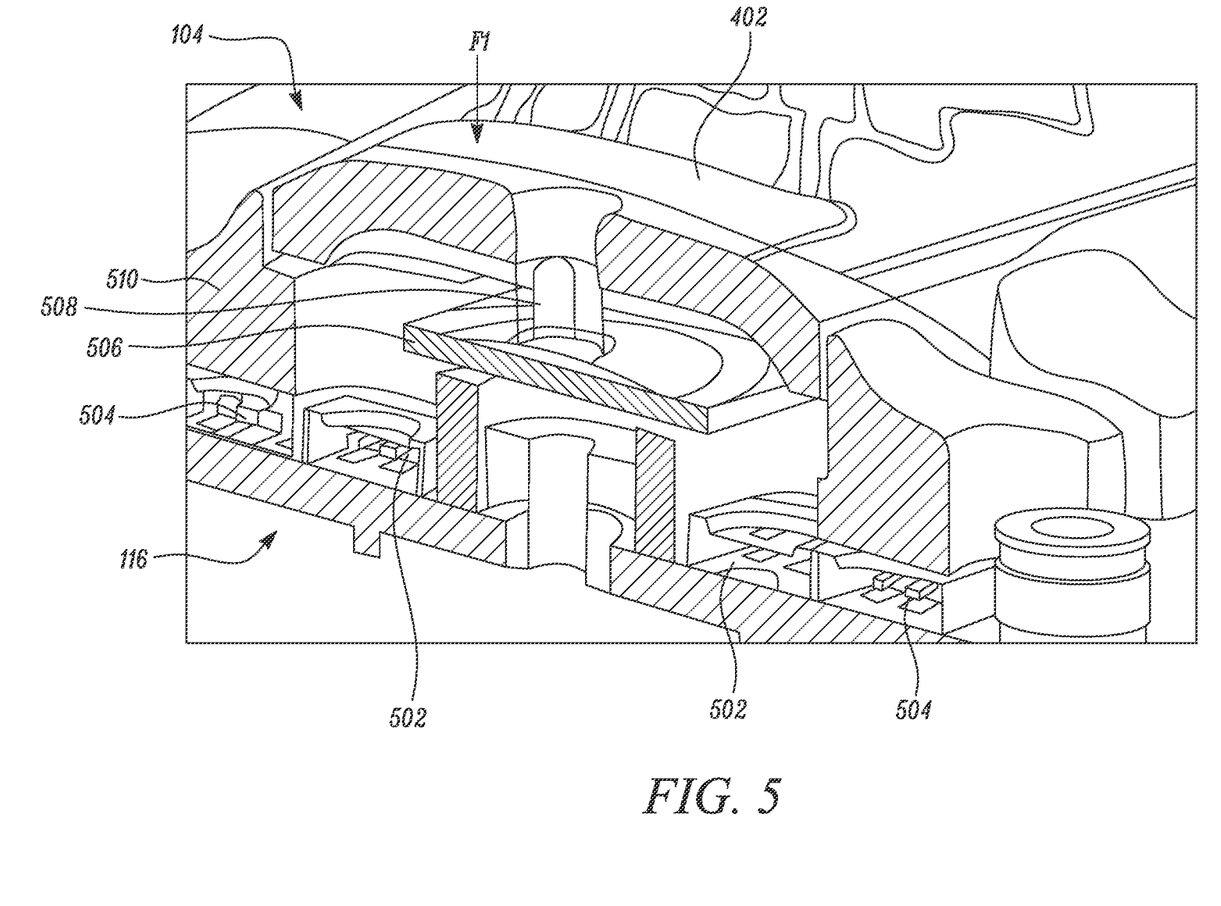
FIG. 5 illustrates a piezoelectric switch associated with the steering housing according to certain embodiments of the disclosure.

As shown in the embodiment of FIG. 5, piezoelectric switch 506 is disposed within steering housing 104. Piezoelectric switch 506 is embodied as a commercially available electrical switch that operates on piezoelectric effect. Piezoelectric switch 506 may include a piezoelectric element and an integrated semiconductor device. Based on application of force "F1" on piezoelectric element, a charge is generated by piezoelectric element causing the integrated semiconductor device to actuate piezoelectric switch 506. In one embodiment, a shaft 508 is connected between piezoelectric switch 506 and input area 402 such that force "F1" applied on input area 402 is transmitted by shaft 508 to piezoelectric switch 506 thereby actuating piezoelectric switch 506. In an embodiment, piezoelectric switch 506 may be electrically connected to PCB 406 or control unit 302 that may receive an electric signal from piezoelectric switch 506 based on an actuation of piezoelectric switch 506. In other embodiments, each piezoelectric switch 506 may include PCBs (not shown) that receives and transmits electric signal to PCB 406 based on actuation of corresponding piezoelectric switch 506. In one embodiment, the pressure sensitive component 404 may include multiple piezoelectric switches arranged within steering housing 104 such that user input is determined when user applies force "F 1" anywhere on input area 402.

Figure 6:
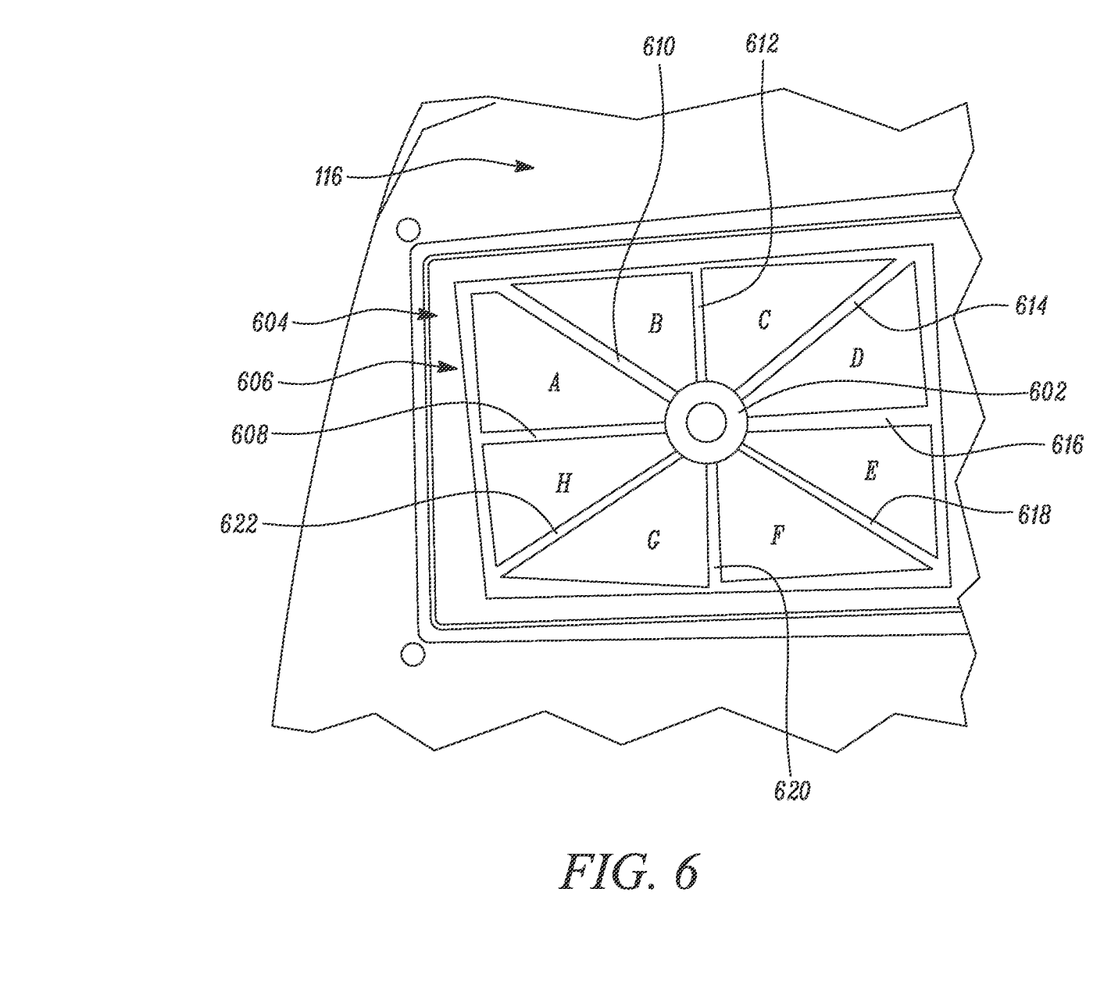
FIG. 6 illustrates a piezoelectric sensor and a webbing arrangement according to certain embodiments of the disclosure.

As shown in the embodiment of FIG. 6, piezoelectric sensor 602 is disposed within steering housing 104. Piezoelectric sensor 602 may be centrally located below input area 402. Piezoelectric sensor 602 is disc shaped. In other embodiments, piezoelectric sensor 602 may include any other shape. Piezoelectric sensor 602 is embodied as commercially available piezoelectric sensor that includes a piezoelectric material and a base. Force "F 1" (shown in FIGS. 5 and 7) applied on piezoelectric material generates an electric signal. In an embodiment, piezoelectric sensor 602 may be electrically connected to PCB 406 or control unit 302 that may receive electric signal from piezoelectric sensor 602 based on application of force "F1". In other embodiments, piezoelectric sensor 602 may include PCBs (not shown) that receives and transmits electric signal to PCB 406 based on application of force "F1".

Further, steering housing 104 includes a webbing arrangement 604. Webbing arrangement 604 is molded on an internal surface 116 of steering housing 104. Webbing arrangement 604 transmits force "F1" applied at any location on input area 402 of steering housing 104 to piezoelectric sensor 602. As shown in the accompanying figure, webbing arrangement 604 includes a rectangular webbing 606 and eight linear webbings 608. Eight linear webbings 608, 610, 612, 614, 616, 618, 620, 622 of webbing arrangement 604 is connected to piezoelectric sensor 602, one such webbing 608 is shown connected to piezoelectric sensor 602 in FIG. 7. Further, eight linear webbings 608, 610, 612, 614, 616, 618, 620, 622 connect rectangular webbing 606 with piezoelectric sensor 602 that such that force "F 1" applied on any webbing 606, 608, 610, 612, 614, 616, 618, 620, 622 is transmitted to piezoelectric sensor 602.

Rectangular webbing 606 and linear webbings 608, 610, 612, 614, 616, 618, 620, 622 are arranged such that webbing arrangement 604 defines eight distinct portions "A", "B", "C", "D", "E", "F", "G", "H". Eight distinct portions "A", "B", "C", "D", "E", "F", "G", "H" are defined between a portion of rectangular webbing 606 and respective linear webbings 608, 610, 612, 614, 616, 618, 620, 622. For example, portion "A" is defined between a portion of rectangular webbing 606 and linear webbings 608, 610, portion "B" is defined between a portion of rectangular webbing 606 and linear webbings 610, 612, and so on. Thus, user input applied anywhere on portion "A" is transmitted to piezoelectric sensor 602 via linear webbings 608, 610, user input applied anywhere on portion "B" is transmitted to piezoelectric sensor 602 via linear webbings 612, 614, and so on. In other embodiments, webbing arrangement 604 and a number of webbings 606, 608, 610, 612, 614, 616, 618, 620, 622 may vary based on system requirements.

Figure 8:
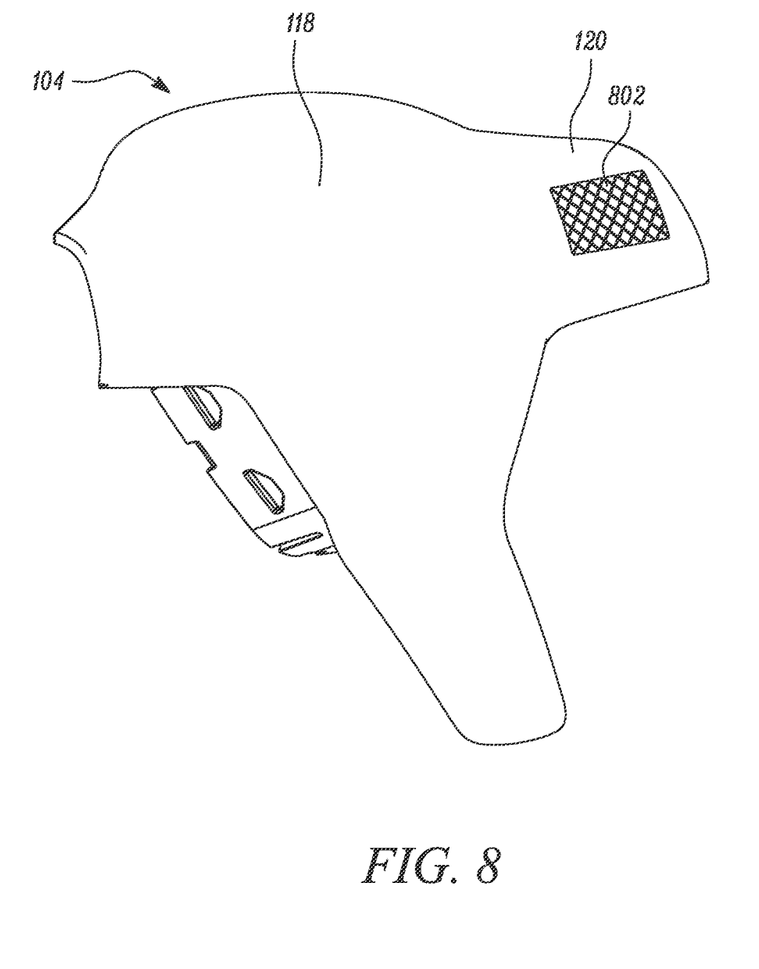
FIG. 8 illustrates a capacitive array associated with the steering housing according to certain embodiments of the disclosure.

In embodiments, user input determination system 400 determines user inputs using capacitive sensing. FIG. 8 illustrates such an embodiment where pressure sensitive component 404 is embodied as a capacitive array 802 disposed at first portion 120 of steering housing 104. In embodiments, steering housing 104 may include a set of capacitive arrays provided at each of first and second portions 120, 122 of steering housing 104. Further, capacitive array 802 may be printed on film during manufacturing of steering housing 104. Capacitive array 802 may include a number of capacitive sensors that are arranged to allow determination of user input. Such capacitive sensor may include any one of an active capacitive sensor or a passive capacitive sensor. Capacitive array 802 senses proximity of user's finger. In certain embodiments, capacitive array 802 senses user inputs through gestures made directly on input area 402 and/or through proximate interaction of user's touch on input area 402. For example, capacitive array 802 may sense that user's finger is approaching capacitive array 802. Further, capacitive array 802 may sense various types of user inputs or gestures, for example, swiping right, sliding up and down, swiping down, clicking, long pressing etc.

In other embodiments, capacitive array 802 may include one or more indicators (not shown). Such indicators may notify user regarding a type of gesture that has to be performed to change or update a functionality of vehicle. In still other embodiments, user input determination system 400 determines user inputs using a combination of a capacitive or inductive sensor and a force sensor or a pressure sensor. A resistive sensor may also be used to determine user inputs such as long pressing.

Figure 9:
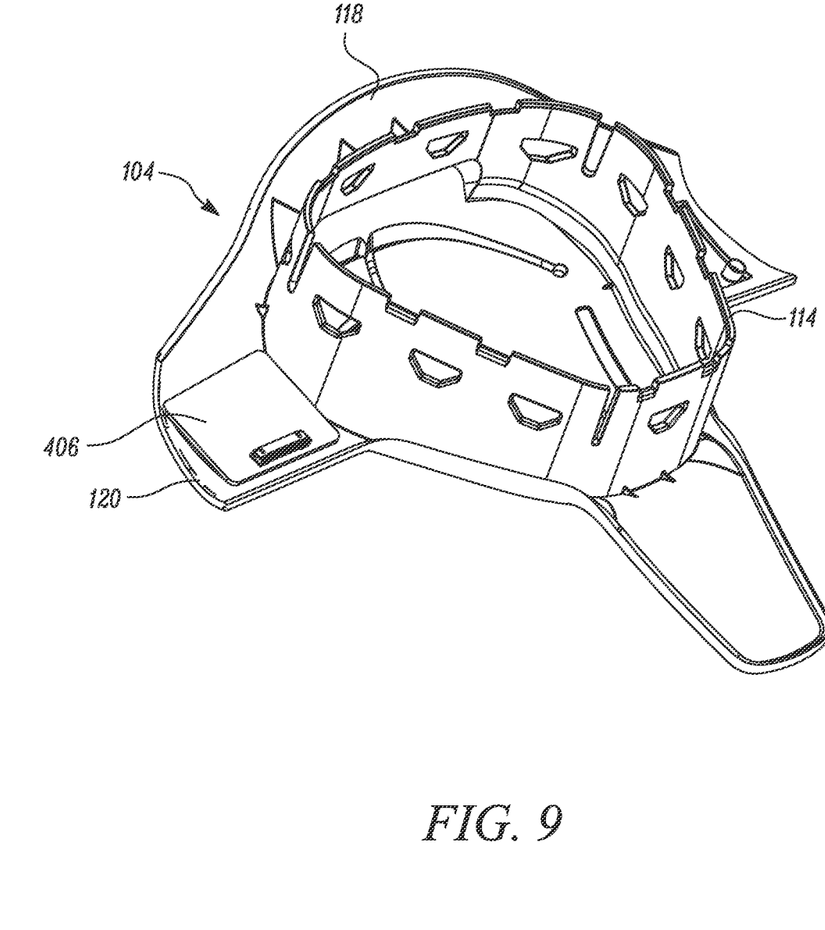
FIG. 9 illustrates a Printed Circuit Board (PCB) disposed in the steering housing according to certain embodiments of the disclosure.

As shown in FIG. 9, user input determination system 400 also includes PCB 406 that is disposed within steering housing 104. In embodiments, PCB 406 is electrically connected to PCB of pressure sensitive components 404. In the illustrated embodiment, a single PCB 406 is connected to pressure sensitive component 404. In other embodiments, user input determination system 400 may include multiple PCBs based on a number of pressure sensitive components 404. PCB 406 is connected to pressure sensitive component 404 through a connection bus 1002 (shown in FIG. 10). In the illustrated embodiment, PCB 406 is disposed in the first portion 120 of steering housing 104. However, in alternative embodiments, PCB 406 is disposed in second portion 122 of steering housing 104. In another embodiment, an additional PCB may be disposed in second portion 122 of steering housing 104.

As shown in FIG. 4, PCB 406 includes a controller 408 that receives electric signals from pressure sensitive component 404. Controller 408 determines user inputs based on received electric signals. In certain embodiments, user trains controller 408 to determine user-defined inputs. Such user-defined inputs are stored in a user profile. User profile can also store user-defined mapping of user inputs to functionality. Specifically, user may define what user input corresponds to what functionality.

Further, controller 408 generates output signals based on electric signals received from pressure sensitive component 404. Output signals are embodied as control signals for changing settings of one or more system of vehicle. For example, output signal may result in changing a setting of an air conditioning unit of vehicle, a lighting system of vehicle, and/or a music system of vehicle, or changing a setting of a driver-assist mode or an autonomous-driving mode. Output signals may be directly sent to control unit 410 of vehicle or to individual systems of vehicle. Further, output signals may also be sent to a display unit 412. Display unit 412 may be present on steering wheel assembly 100 or it may be present anywhere in a cab of vehicle where user is seated. In embodiments, display unit may include a tablet or smartphone. Display unit 412 may provide notifications to user regarding change in vehicle system settings or selections made by user. Output signals may also be transmitted to other remote devices that are connected to vehicle. For example, a tablet or smartphone may be connected to vehicle through short distance communication techniques, for example Bluetooth technology.

Controller 408 also generates another set of output signals that are transmitted to pressure sensitive component 404. Such output signals include a haptic feedback that is provided to user by pressure sensitive component 404. Specifically, pressure sensitive component 404 of user input determination system 400 provides haptic feedback to user indicative of selections made by user. In certain embodiments, user trains controller 408 such that controller 408 determines user-defined inputs and provides user-defined haptic feedback. User-defined inputs and haptic feedback are stored in a user profile. User profile can also store user-defined mapping of user inputs to functionality and haptic feedback to functionality. Specifically, user may define what user input and/or haptic feedback corresponds to what functionality.

In embodiments, pressure sensitive component 404 provides haptic feedback to user through user's finger that is interacting with input area 402 (see FIG. 1). For example, if user uses his thumb to interact with input area 402, then haptic feedback is provided to thumb of user. The intensity and duration of haptic feedback provided may vary based on the nature or type of the feedback that pressure sensitive component 404 is designed to provide for the given functionality. For example, haptic feedback may include shorter or longer bursts of haptic feedback pulses, closer or more spaced apart bursts of haptic feedback pulses, or varying intensity haptic feedback pulses.

In embodiments, haptic feedback provided by pressure sensitive component 404 may provide information regarding current settings of system associated with the respective functionality to user. In embodiments, haptic feedback provided through pressure sensitive component 404 may change in amplitude as functionality is increased or decreased. For example, if user decreases a following distance in driver-assist mode or autonomous-driving mode, haptic feedback may increase in frequency and/or intensity indicating appropriate changes in system settings based on user inputs. Exemplary haptic feedbacks may include slide vibration, release, click, hold vibration, touch vibrations, gradual slide vibrations, and/or release and single vibration. The functionality and mapping of user inputs to control the corresponding functionalities is provided herein on an exemplary basis.

The software data associated with user input determination system 400 may be updated from time to time. In embodiments, an over-the-air (OTA) update is used to add, subtract, or alter the user inputs or haptic feedback. For example, after the vehicle is delivered to user, an OTA update may alter the rectification or adjustment of a click force or scroll feeling associated with pressure sensitive component 404. Further, an OTA update may change the input gesture associated with functionality from one gesture to another, from a double click to double tap, from swipe to slide, or another change. OTA updates open possibilities to adjust haptic feedback and gesture inputs, including based on versatile customer data after vehicles are delivered to customers or based on driver feedback. Depending on the level of driver-assist or autonomous-driving functionality of the vehicles, the OTA updates have different user inputs or haptic feedback. For example, when a vehicle supports autonomous driving, the user inputs may include more inputs requiring more additional gestures. The inputs may access functionality that would be too distracting when driven by a human driver, even with driver-assist functionality, such as television or other display, or multimedia functionality. In embodiments, the input may be handwriting or other complex gestures.

Controller 408 and control unit 302 may embody a single microprocessor or multiple microprocessors. Numerous commercially available microprocessors can be configured to perform the functions of controller 408 and control unit 302. Controller 408 and control unit 302 may include all the components required to run an application such as, for example, a memory, a secondary storage device, and a processor, such as a central processing unit. Various other known circuits may be associated with controller 408 and control unit 302, including power supply circuitry, signal-conditioning circuitry, communication circuitry, and other appropriate circuitry.

Figure 11:
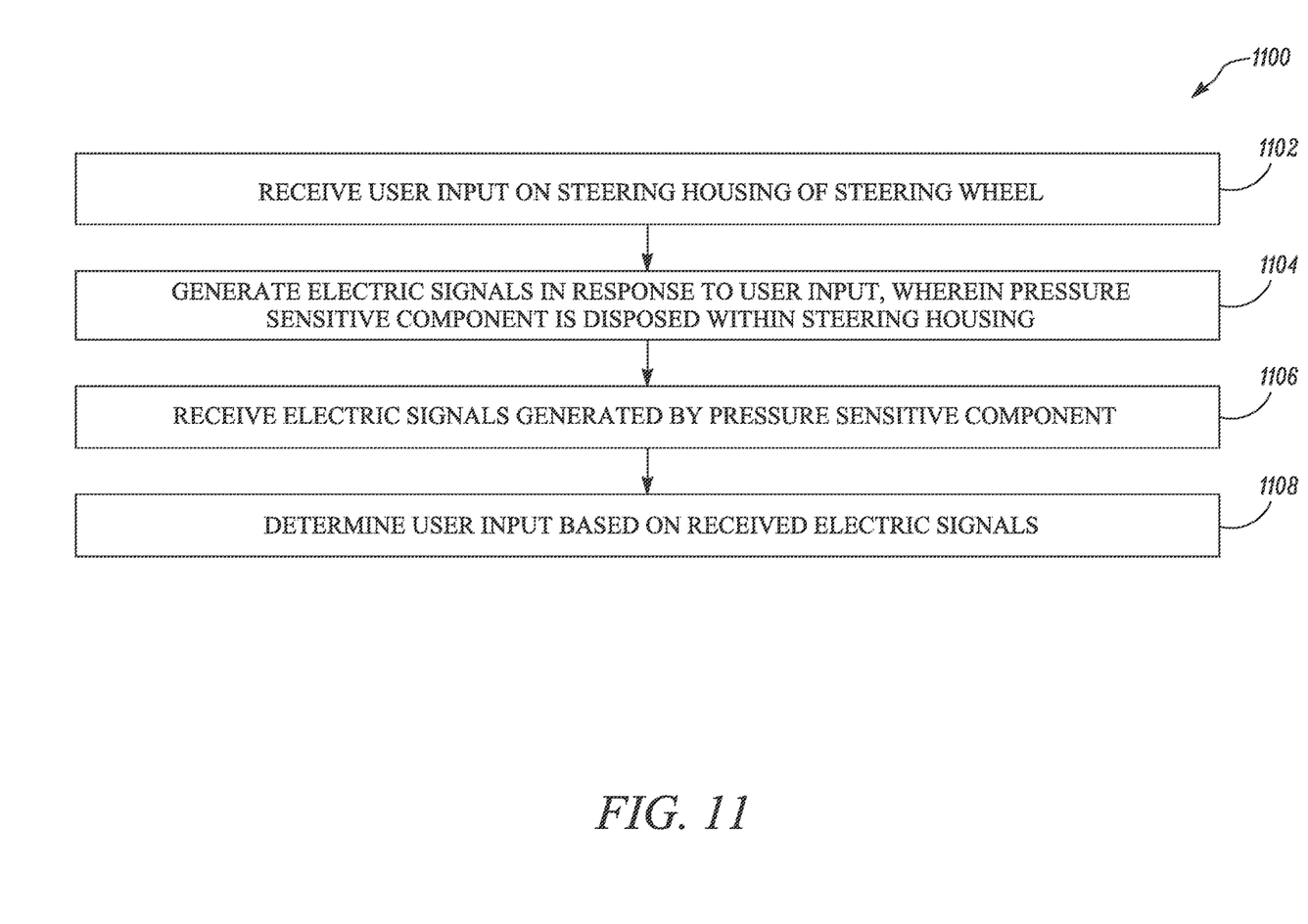
FIG. 11 illustrates a flowchart for a method of determining the user input on the steering wheel assembly according to certain embodiments of the disclosure.

FIG. 11 illustrates a flowchart for a method 1100 of determining user input on steering wheel assembly 100. At step 1102, user input is received on input area 402 of steering housing 104. At step 1104, pressure sensitive component 404 generates electric signals in response to user input. Pressure sensitive component 404 is disposed within steering housing 104 below input area 402 such that user input causes application of force "F1" on pressure sensitive component 404. At step 1106, electric signals generated by pressure sensitive component 404 is received by controller 408 of PCB 406. At step 1108, controller 408 determines user input based on received electric signals. In embodiments, determination of user input includes determination of gesture made by user on steering housing 104.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, a person of ordinary skill in the art will recognize that changes may be made in form and detail without departing from the scope of the present disclosure. Thus, the present disclosure is limited only by the claims.

In the foregoing specification, the disclosure has been described with reference to specific embodiments. However, as one skilled in the art will appreciate, various embodiments disclosed herein can be modified or otherwise implemented in various other ways without departing from the spirit and scope of the disclosure. Accordingly, this description is to be considered as illustrative and is for the purpose of teaching those skilled in the art the manner of making and using various embodiments of the disclosure. It is to be understood that the forms of disclosure herein shown and described are to be taken as representative embodiments. Equivalent elements, materials, processes or steps may be substituted for those representatively illustrated and described herein. Moreover, certain features of the disclosure may be utilized independently of the use of other features, all as would be apparent to one skilled in the art after having the benefit of this description of the disclosure. Expressions such as "including", "comprising", "incorporating", "consisting of", "have", "is" used to describe and claim the present disclosure are intended to be construed in a non-exclusive manner, namely allowing for items, components or elements not explicitly described also to be present. Reference to the singular is also to be construed to relate to the plural.

Further, various embodiments disclosed herein are to be taken in the illustrative and explanatory sense, and should in no way be construed as limiting of the present disclosure. All joinder references (e.g., attached, affixed, coupled, connected, etc.) are only used to aid the reader's understanding of the present disclosure, and may not create limitations, particularly as to the position, orientation, or use of the systems and/or methods disclosed herein. Therefore, joinder references, if any, are to be construed broadly. Moreover, such joinder references do not necessarily infer that two elements are directly connected to each other.

Additionally, all numerical terms, such as, but not limited to, "first", "second", "third", "primary", "secondary", "main" or any other ordinary and/or numerical terms, should also be taken only as identifiers, to assist the reader's understanding of the various elements, embodiments, variations and/or modifications of the present disclosure, and may not create any limitations, particularly as to the order, or preference, of any element, embodiment, variation and/or modification relative to, or over, another element, embodiment, variation and/or modification.

It will also be appreciated that one or more of the elements depicted in the drawings/figures can also be implemented in a more separated or integrated manner, or even removed or rendered as inoperable in certain cases, as is useful in accordance with a particular application. Additionally, any signal hatches in the drawings/figures should be considered only as exemplary, and not limiting, unless otherwise specifically specified.

What is claimed is:

1. A steering wheel housing comprising:
   at least one pressure sensitive component, the at least one pressure sensitive component adapted to generate electric signals in response to a plurality of input applied to an input area on the steering wheel housing, the plurality of input combinable to form a user gesture characterized as being associated with a particular vehicle functionality, wherein each input comprises a force applied on the input area; and
   a plurality of webbings presented on an internal surface of the steering wheel housing and forming the input area, wherein the webbings are connected to the at least one pressure sensitive component, wherein the webbings define portions which are configured to transmit, via a respective subset of the plurality of webbings, force applied on the portions to the at least one pressure sensitive component, and wherein a particular input, which comprises a touch input with greater than a threshold measure associated with force, applied to any of the portions indistinguishably actuates the at least one pressure sensitive component, such that the particular input is interpreted as a same input for the user gesture.

2. The steering wheel housing of claim 1, wherein the at least one pressure sensitive component includes at least one piezoelectric switch.

3. The steering wheel housing of claim 1, wherein the at least one pressure sensitive component includes a piezoelectric sensor.

4. The steering wheel housing of claim 3, wherein the piezoelectric sensor is disc-shaped.

5. The steering wheel housing of claim 1, wherein the plurality of webbings is molded on the internal surface.

6. The steering wheel housing of claim 1, wherein the at least one pressure sensitive component includes a capacitive array.

7. The steering wheel housing of claim 1, further comprising at least one Printed Circuit Board (PCB), wherein the PCB is electrically connected to the at least one pressure sensitive component.

8. The steering wheel housing of claim 7, wherein the PCB further includes a controller configured to generate output signals based on the electric signals received from the at least one pressure sensitive component.

9. The steering wheel housing of claim 8, wherein the controller is further configured to determine the user gesture based on the received electric signals.

10. The steering wheel housing of claim 1, wherein the at least one pressure sensitive component is further adapted to provide a haptic feedback which is reflective of the combined plurality of input.

11. The steering wheel housing of claim 1, wherein input provided to a particular portion of the plurality of portions is not automatically associated with the particular vehicle functionality.

12. A steering wheel assembly comprising:
    a steering rim;
       a steering housing connected to the steering rim;
       at least one pressure sensitive component disposed within the steering housing, the at least one pressure sensitive component adapted to generate electric signals in response to a plurality of input applied to an input area on the steering wheel housing, the plurality of input combinable to form a user gesture characterized as being associated with a particular vehicle functionality, wherein each input comprises a force applied on the input area;
       a plurality of webbings presented on an internal surface of the steering housing and forming the input area, wherein the webbings are connected to the at least one pressure sensitive component, wherein the plurality of webbings define a plurality of input portions, wherein each input portion is configured to transmit, via a respective subset of the plurality of webbings, force applied on the input portion to the at least one pressure sensitive component, and wherein an input applied to any of the portions is indistinguishably transmitted to the at least one pressure sensitive component, such that the input is interpreted as a same input for the user gesture; and
       a controller disposed within the steering housing, wherein the controller is electrically connected to the at least one pressure sensitive component,
       wherein the at least one pressure sensitive component is adapted, by the controller, to provide haptic feedback responsive to the user gesture, and wherein the provided haptic feedback reflects a processing result associated with the particular vehicle functionality.

13. The steering wheel assembly of claim 12, wherein the at least one pressure sensitive component includes at least one piezoelectric switch.

14. The steering wheel assembly of claim 12, wherein the at least one pressure sensitive component includes a piezoelectric sensor.

15. The steering wheel assembly of claim 14, wherein the piezoelectric sensor is disc-shaped.

16. The steering wheel assembly of claim 12, wherein the plurality of webbings is molded on the internal surface.

17. The steering wheel assembly of claim 12, wherein the at least one pressure sensitive component includes a capacitive array.

18. The steering wheel assembly of claim 12, wherein the processing result indicates a current setting associated with the particular vehicle functionality, and wherein the controller is configured to change amplitude of the haptic feedback as the current setting of the particular vehicle functionality is increased or decreased via the user gesture.

19. A method of determining a user input on a steering wheel assembly, the method comprising:

receiving a plurality of input on an input area of a steering housing of the steering wheel assembly, the plurality of input combinable to form a user gesture, the input area comprising a plurality of webbings defining a plurality of input portions, wherein the webbings are connected to a particular pressure sensitive component, wherein each input portion is configured to transmit, via a respective subset of the plurality of webbings, force applied on the input portion to a particular pressure sensitive component, and wherein an input applied to any of the portions is indistinguishably transmitted to the at least one pressure sensitive component, such that the input is interpreted as a same input for the user gesture;

generating, via the particular pressure sensitive component, electric signals in response to the received input, wherein the particular pressure sensitive component is disposed within the steering housing;

receiving, at a controller, the electric signals generated by the particular pressure sensitive component;

determining, via the controller based on the received electrical signals, that the received plurality of input is indicative of the user gesture which is characterized as being associated with a particular vehicle functionality; and causing, via the controller, the pressure sensitive component to provide haptic feedback responsive to the user gesture, wherein the provided haptic feedback reflects a processing result associated with the particular vehicle functionality.

20. The method of claim 19, wherein the processing result indicates a current setting associated with the particular vehicle functionality, and wherein the controller changes amplitude of the haptic feedback as the current setting of the particular vehicle functionality is increased or decreased via the user gesture.

* * * * *